(12) United States Patent
Potter et al.

(10) Patent No.: US 6,688,179 B2
(45) Date of Patent: Feb. 10, 2004

(54) ELECTROSTATIC PRESSURE TRANSDUCER AND A METHOD THEREOF

(75) Inventors: Michael D. Potter, Churchville, NY (US); Alexander E. Martens, Rochester, NY (US)

(73) Assignee: Nth Tech Corporation, Churchville, NY (US)

( * ) Notice: Subject to any disclaimer, the term of this patent is extended or adjusted under 35 U.S.C. 154(b) by 0 days.

(21) Appl. No.: 10/280,264

(22) Filed: Oct. 24, 2002

(65) Prior Publication Data

US 2003/0079548 A1 May 1, 2003

Related U.S. Application Data

(60) Provisional application No. 60/336,771, filed on Oct. 26, 2001.

(51) Int. Cl.[7] .................................................. G01L 7/00
(52) U.S. Cl. ........................... 73/700; 257/252; 257/248
(58) Field of Search .............................. 73/700, 514.32; 361/280; 257/252, 248

(56) References Cited

U.S. PATENT DOCUMENTS

| | | |
|---|---|---|
| 3,858,307 A | 1/1975 | Yoshimura et al. |
| 4,160,882 A | 7/1979 | Driver |
| 5,054,081 A | 10/1991 | West |
| 5,349,492 A | 9/1994 | Kimura et al. |
| 5,365,790 A | 11/1994 | Chen et al. |
| 5,367,429 A * | 11/1994 | Tsuchitani et al. .......... 361/280 |
| 6,051,853 A * | 4/2000 | Shimada et al. ............ 257/252 |
| 6,324,914 B1 | 12/2001 | Xue et al. |
| 6,470,754 B1 | 10/2002 | Gianchandani |
| 2001/0047689 A1 * | 12/2001 | McIntosh .................. 73/514.32 |

* cited by examiner

*Primary Examiner*—Edward Lefkowitz
*Assistant Examiner*—Andre Allen
(74) *Attorney, Agent, or Firm*—Nixon Peabody LLP

(57) ABSTRACT

A pressure transducer system includes a housing with a chamber, a member with a stored electrical charge, and a pair of electrodes that are at least partially in alignment with each other. At least a portion of the chamber is at a reference pressure. The member is connected to the housing and extends across at least a portion of the chamber. Each of the pair of electrodes is connected to the housing and is spaced from and on substantially opposing sides of the member. The member is movable with respect to the pair of electrodes or one of the pair of electrodes is movable with respect to the member in response to a monitored pressure.

24 Claims, 7 Drawing Sheets

ELECTROSTATIC PRESSURE TRANSDUCER AND A METHOD THEREOF

The present invention claims the benefit of U.S. Provisional Patent Application Ser. No. 60/336,771, filed Oct. 26, 2001, which is hereby incorporated by reference in its entirety.

FIELD OF THE INVENTION

This invention generally relates to transducers and, more particular to an electrostatic pressure transducer.

BACKGROUND OF THE INVENTION

A transducer is an electronic device that converts energy from one form to another. Typically, a transducer may include a diaphragm which moves or vibrates in response to a some form of energy, such as sound. Some common examples of transducers with diaphragms are microphones, loudspeakers, thermometers, position and pressure sensors.

One of the problems with prior pressure transducers is with their sensitivity. Often these pressure transducers can not detect small changes in pressure.

SUMMARY OF THE INVENTION

A pressure transducer system in accordance with one embodiment of the present invention includes a housing with a chamber, a member with a stored electrical charge, and a pair of electrodes that are at least partially in alignment with each other. At least a portion of the chamber is at a reference pressure. The member is connected to the housing and extends across at least a portion of the chamber. Each of the pair of electrodes is spaced from and on substantially opposing sides of the member. The member is movable with respect to the pair of electrodes or one of the pair of electrodes is movable with respect to the member in response to a monitored pressure.

A method for making a pressure transducer system in accordance with another embodiment of the present invention includes providing a housing with a chamber. At least a portion of the chamber is at a reference pressure. A member with a stored electrical charge is provided. The member is connected to the housing and extends across at least a portion of the chamber. A pair of electrodes is provided. Each of the pair of electrodes is connected to the housing and is spaced from and on substantially opposing sides of the member. The member is movable with respect to the pair of electrodes or one of the pair of electrodes is movable with respect to the member in response to a change in pressure.

A method for measuring pressure in accordance with another embodiment of the present invention includes exposing a member with a stored electrical charge or one of a pair of electrodes to a pressure to be measured. The member is connected to a housing with a chamber and extends across at least a portion of the chamber. Each of the pair of electrodes is spaced from and on substantially opposing sides of the member. The member is moved with respect to the pair of electrodes or one of the pair of electrodes is moved with respect to the member in response to a monitored pressure. The movement of the member or one of the pair of electrodes is measured and the pressure is determined based on the measured movement.

The present invention uses embedded electrical charge trapped at the interface of dissimilar insulators. The electronic charge density of the present invention can be three to four orders of magnitude greater than that of known electret materials. Thus, the present invention has a significant advantage in sensitivity. Furthermore the size of pressure transducers based on the present invention can be made very much smaller than pressure transducers using electrets, and yet have comparable or greater sensitivity. Hence, such pressure transducers can be designed as MEMS devices.

The present invention provides a pressure transducer which is extremely sensitive to slight changes in pressure. With the present invention, a change of position of a member or one of the pair of electrodes of less than one nanometer can be detected. The present invention is useful for detecting static, quasi-static, and dynamic changes in pressure and can be used to detect such pressure changes in gasses, liquids, or solids when used as a weighing scale.

DETAILED DESCRIPTION

Figure 10:
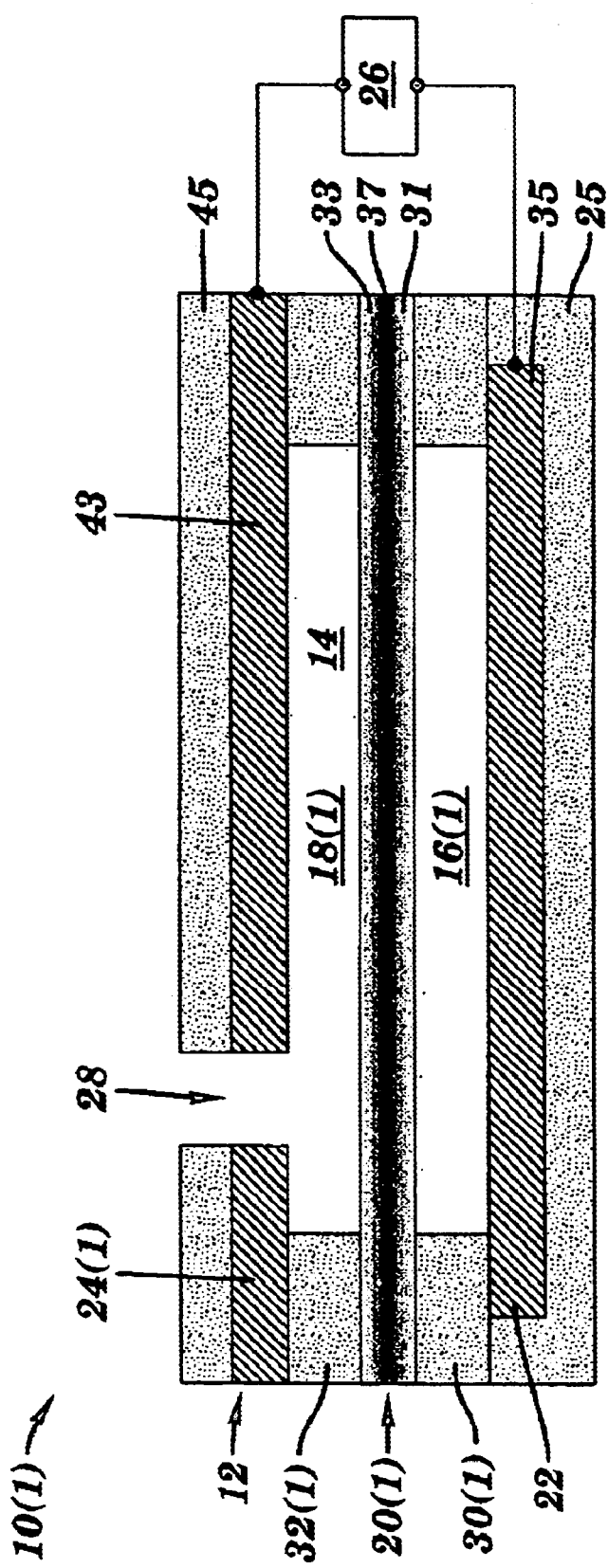

A pressure transducer system 10(1) in accordance with one embodiment of the present invention is shown in FIG. 10. The pressure transducer system 10(1) includes a housing 12 with an chamber 14 with a first compartment 16(1) and a second compartment 18(1), a member 20(1) with a stored electrical charge, and a pair of electrodes 22 and 24(1) that are at least partially in alignment with each other. The present invention provides a pressure transducer system which is extremely sensitive to slight changes is pressure.

Referring to FIG. 10, the housing 12 which defines the chamber 14 is made of a variety of layers, although other types of supporting structures in other configurations and other numbers of layers, such as one or more, made of other materials can be used. The size of the housing 12 and of the chamber 14 can vary as required by the particular application.

The member 20(1) is connected to an inner wall of the housing 12 and splits the chamber 14 into two compartments 16(1) and 18(1), although other configurations can be used. The compartments 16(1) and 18(1) have substantially the same size and each of the first and second electrodes 22 and 24(1) is initially spaced substantially the same distance from the member 20(1), although other configurations can be used. One of the compartments 16(1) is sealed with a fluid, such as air, at a reference pressure, although other types of fluids and/or materials can be used or the compartment could be sealed in a vacuum. The reference pressure for the compartment 16(1) can be set to a desired pressure for the particular application which could be zero in the case of a vacuum. The other compartment 18(1) has a passage 28 that permits the fluid, such as the ambient air, whose pressure is going to be monitored and/or measured to enter, although the compartment 18(1) can have other numbers of passages and other types of fluids can enter the compartment. The position of the member 20(1) can be altered as a result of a change in the pressure of the fluid being monitored and/or measured, although other configurations can be used, such as having the member 20(1) being fixed and one of the pair of electrodes 24 whose position can be altered as a result of a change in the pressure of the fluid being monitored and/or measured.

The member 20(1) can store a fixed static electrical charge, although the member could store other types of charge, such as a floating electrical charge. The member 20(1) has a pair of layers 31 and 33 of dielectric material, such as silicon oxide, silicon dioxide, silicon nitride, aluminum oxide, tantalum oxide, tantalum pentoxide, titanium oxide, titanium dioxide, barium strontium titanium oxide, although other types of materials and other numbers of layers, such as one or three or more layers can be used. The layers 31 and 33 are seated against each other along an interface 37 were the fixed static electrical charge is stored. The member 20(1) can hold a fixed charge on the order of at least $1 \times 10^{10}$ q/cm$^2$. This is substantially higher than the amount of charge held by an electret material which only holds up to about $1 \times 10^{10}$ q/cm$^2$.

The pair of electrodes 22 and 24(1) are located in the inner walls of the housing 12 in chamber 14, although other configurations for connecting the pair of electrodes 22 and 24(1) to the housing 12 can be used, such as having each of the first and second electrodes 22 and 24(1) located in the inner walls of the housing 12 and spaced from the chamber 14 by one or more layers of material, such as an insulating material, or by having each of the first and second electrodes 22 and 24(1) seated on the inner walls of the housing 12 in the chamber 14. The first and second electrodes 22 and 24(1) are in substantial alignment with each other and are spaced from and located on a substantially opposing sides of the member 20(1), although other configurations can be used. By way of example only, the distance between each of the pair of electrodes 22 and 24(1) is about 1.0 microns, although this distance can vary.

A pressure monitoring device 26 is coupled to the pair of electrodes 22 and 24(1) and monitors the change in pressure detected by the transducer. In this particular embodiment, the pressure monitoring device 26 is a voltage sensing system that measures the potential difference across the pair of electrodes 22 and 24(1), which corresponds to the change in pressure. Although a pressure monitoring device 26 is shown, other types of devices can be used, such as a programmed computer with programmed instructions stored in memory for execution by a processor for monitoring the change in voltage or other characteristic across the electrodes 22 and 24(1), and converting the monitored characteristic to a pressure reading based on stored tables or other data.

Figure 11:
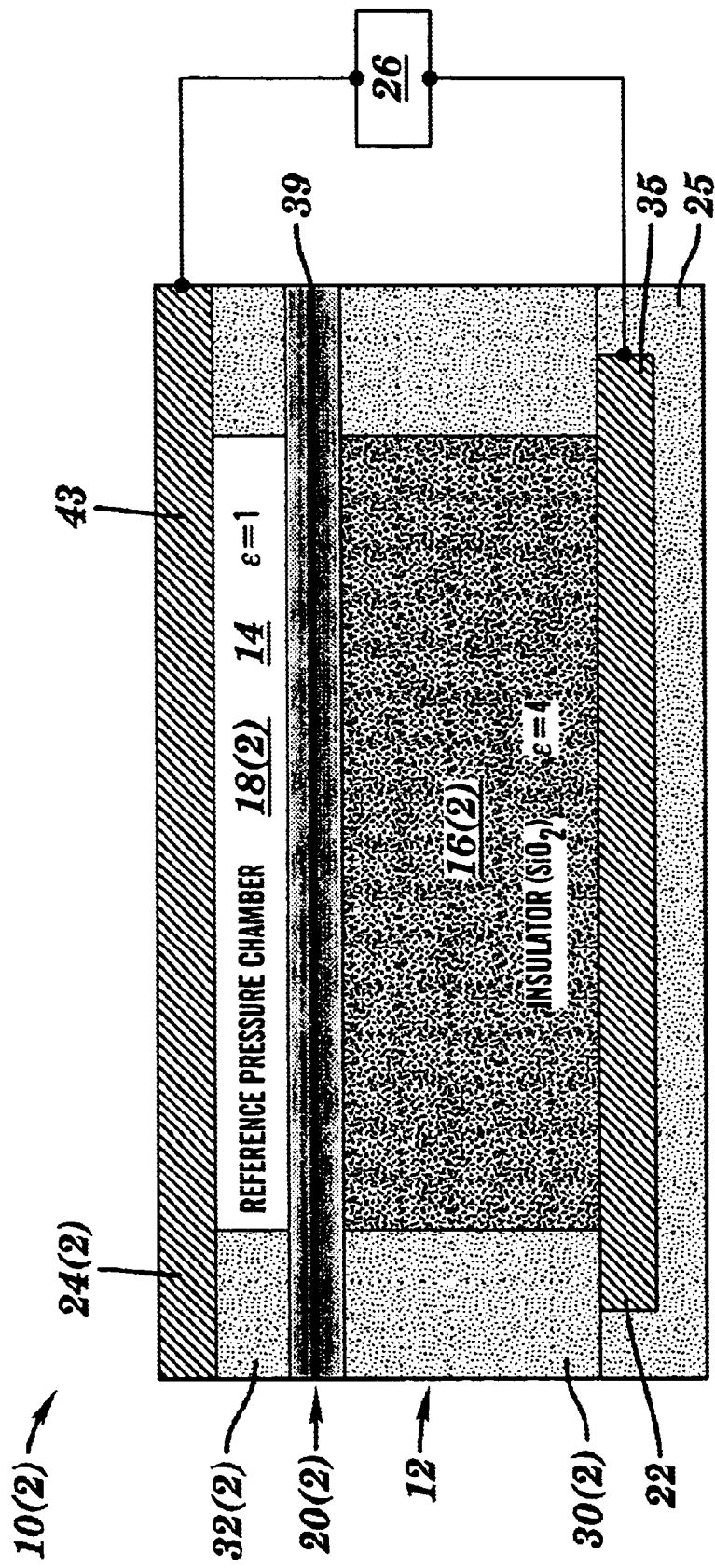
FIG. 11 is a cross-sectional view of a pressure transducer system in accordance with another embodiment of the present invention.

Referring to FIG. 11, a pressure transducer system 10(2) in accordance with another embodiment is shown. Elements in FIG. 11 which are identical to elements shown and described in FIGS. 1–10 will have like numbers and will not be described in detail again here. The member 20(2) comprises a single layer 39 of dielectric material, such as such as silicon oxide, silicon dioxide, silicon nitride, aluminum oxide, tantalum oxide, tantalum pentoxide, titanium oxide, titanium dioxide, barium strontium titanium oxide, in which the fixed static electrical charge is held, although the member 20(2) can have other numbers of layers. The member 20(2) splits the chamber 14 into two compartments 16(2) and 18(2) which are each sealed. The member 20(2) is not flexible and the position of the one of the pair of electrodes 24(2) with respect to the member 20(2) can be altered as a result of a change in the pressure of the fluid being measured, although other configurations can be used.

In this particular embodiment, the first compartment 16(2) is larger than Second compartment 18(2) and each of the electrodes 22 and 24(2) is spaced a different distance from the member 20(2), although other configurations and spacings can be used. The distance each of the electrodes 22 and 24(2) is spaced from the member 20(2) is determined based on the permitivity of the fluid and/or material in each compartment 16(2) and 18(2) as set forth in the following equation:

$$\frac{\tau(16, 2)}{\varepsilon(16, 2)} = \frac{\tau(18, 2)}{\varepsilon(18, 2)}$$

where $\tau$ is the thickness and $\varepsilon$ is the permittivity of the first and second compartments 16(2) and 18(2).

One of the compartments 16(2) is filled with an insulator 41, such as silicon dioxide, although other types of materials and/or fluids could be used. The second compartment 18(2) is sealed with a fluid, such as air, at a reference pressure, although other types of fluids and/or materials can be used and the reference pressure can be set to any desired reference pressure or the second compartment 18(2) can also be a vacuum.

Figure 1:
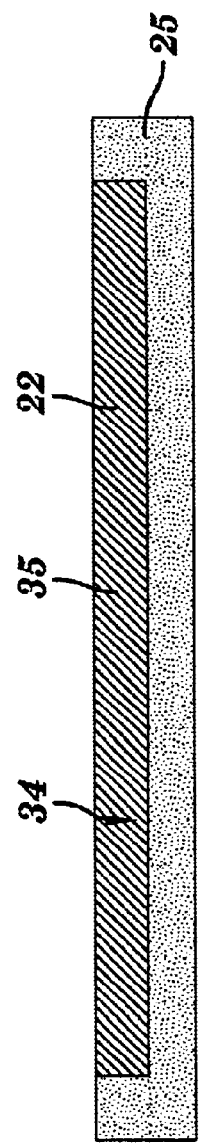
FIGS. 1–10 are cross-sectional views of a method of making a pressure transducer system in accordance with one embodiment of the present invention.

A method for making a pressure transducer system 10(1) in accordance with one embodiment of the present invention is described below with reference to FIGS. 1–10. To make a pressure transducer system 10(1) a suitable substrate 25, such as silicon oxide on silicon, is provided as shown in FIG. 1, although other types of materials could be used. A first trench 34 is formed in the substrate and the first trench 34 is filled with a first conductive layer 35, such as aluminum, although other types of materials could be used. The first conductive layer 35 may be planarized so that only the first trench 34 is filled with the first conductive layer 35. By way of example, this may be done by standard chemical mechanical planarization (CMP) processing, although other techniques can be used. The resulting first conductive layer 35 in the first trench 34 forms the first electrode 22.

Figure 2:
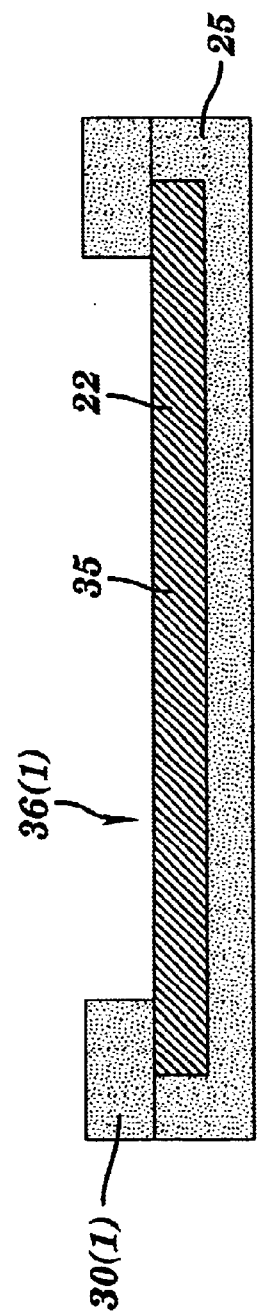

Referring to FIG. 2, a first insulating layer 30(1), such as silicon dioxide SiO$_2$, is deposited on the first conductive material layer 35 and a portion of the substrate 25, although other types of materials could be used. A second trench 36(1) is formed in the first insulating layer 30(1) which is at least in partial alignment with the first electrode 22. The second trench 36(1) is etched to the surface of the first electrode 22, although other configurations can be used, such as leaving a portion of the first insulating layer 30(1) over the first electrode 22 in the first trench 34.

Figure 3:
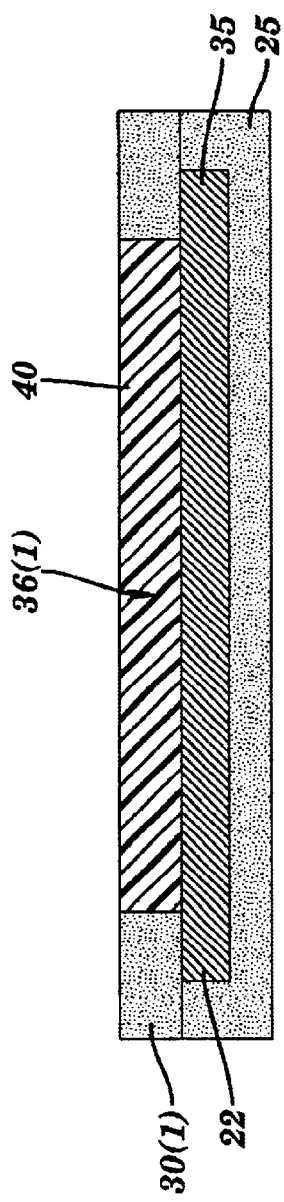

Referring to FIG. 3, the second trench 36(1) is filled with a first sacrificial material 40 and may be planarized. By way of example, this may be done by standard CMP processing, although other techniques can be used.

Figure 4:
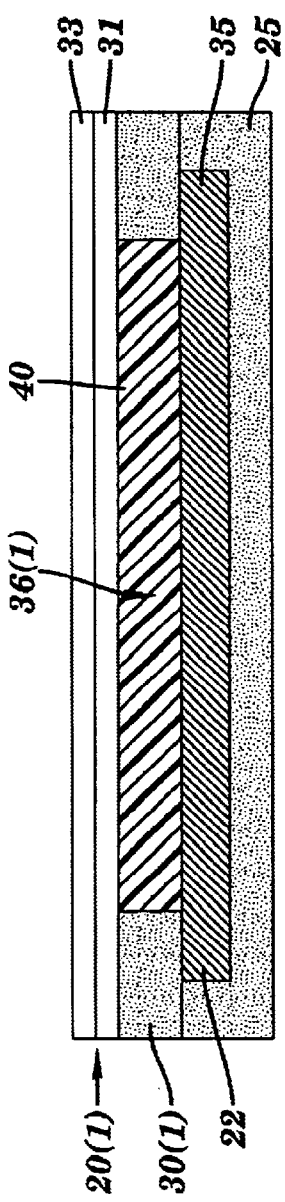
Figure 5:
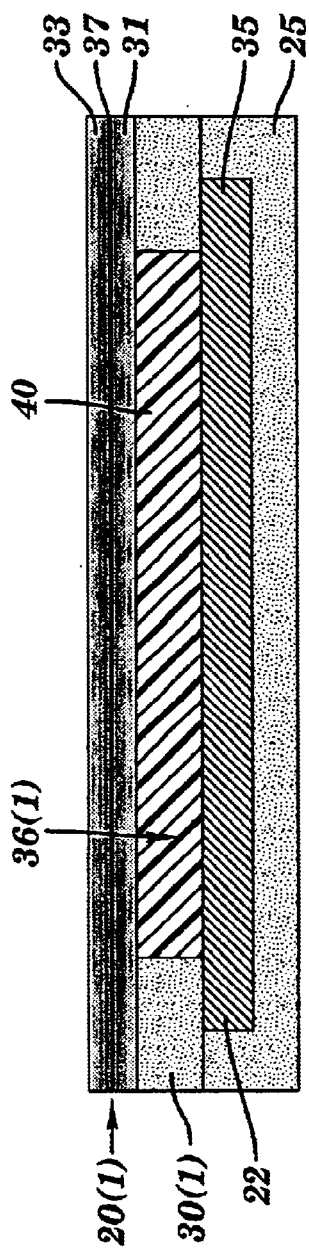

Referring to FIG. 4, a member 20(1) which can store a fixed electrical charge is deposited on a portion of the first insulating layer 30(1) and the first sacrificial material 40. As shown in FIG. 5, in this particular embodiment the member 20(1) comprises two layers 31 and 33 of insulating material, such as silicon oxide and silicon nitride, silicon oxide and aluminum oxide, or any other combination of materials that can store fixed charge can be deposited as the member 20(1). Additionally, the member 20(1) may comprise other numbers of layers of material, such as a member 20(2) with a single layer 39 as shown in FIG. 11 or member with multiple layers. For example, a tri-layer of silicon oxide—silicon nitride—silicon oxide may be used. The member 20(1) is flexible and can move towards and away from the first electrode 22, although the member 20(1) may be rigid and at least one of the electrodes 22 and 24(1) may be flexible.

Referring to FIG. 5, electrical charge is injected into the member 20(1). A variety of techniques for injecting charge can be used, such as a low to medium energy ballistic electron source or by utilizing a sacrificial conductive layer disposed on top of the member 20(1) and subsequently applying an electric field sufficient to inject electrons into the member 20(1), although other techniques can be used.

Figure 6:
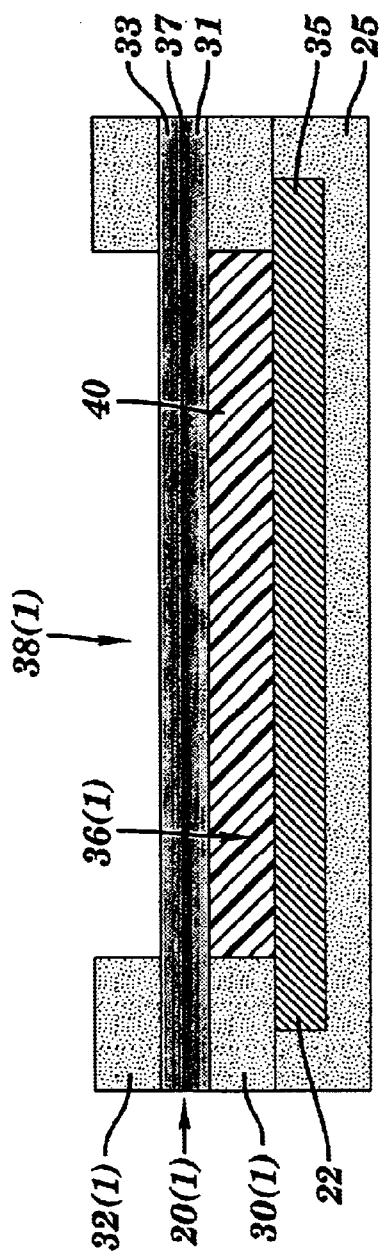

Referring to FIG. 6, a second insulating layer 32(1), such as silicon dioxide $SiO_2$, is deposited on the member 20(1), although other types of materials can be used. Next, a third trench 38(1) is etched in the second insulating layer 32(1) to the member 20(1), although the third trench 38(1) can be etched to other depths. The third trench 38(1) is in substantial alignment with the second trench 36(1), although other arrangements can be used as long as the third trench 38(1) is at least in partial alignment with the second trench 36(1).

Figure 7:
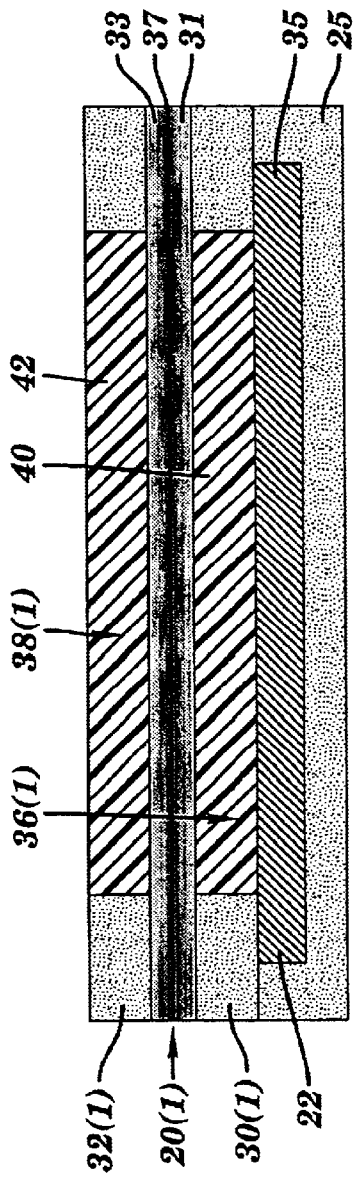

Referring to FIG. 7, the third trench 38(1) is filled with a second sacrificial material 42, such as polysilicon, although other types of material can be used. The second sacrificial material 42 may be planarized.

Figure 8:
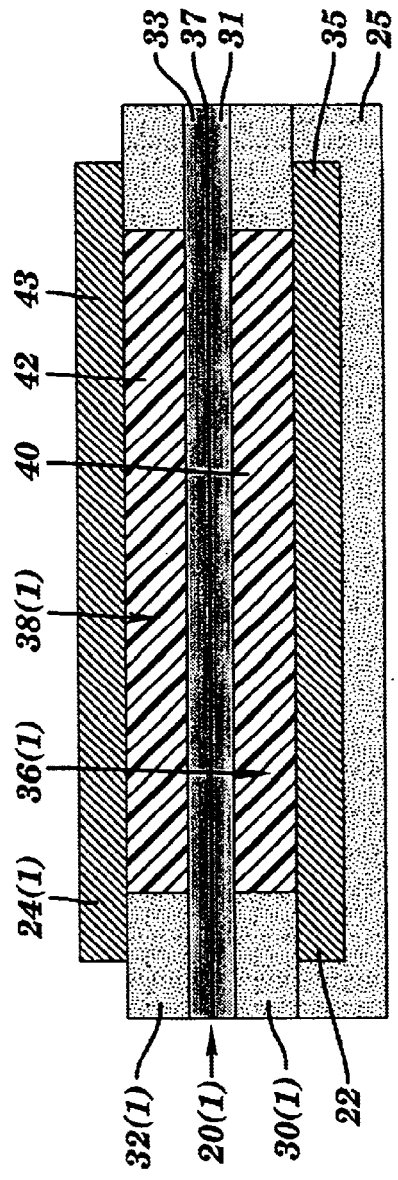

Referring to FIG. 8, a second conductive layer 43, such as aluminum, is deposited on at least a portion of the second insulating layer 32(1) and the second sacrificial material 42, although other types of materials can be used. The second conductive layer 43 forms the second electrode 24(1) in this embodiment.

Figure 9:
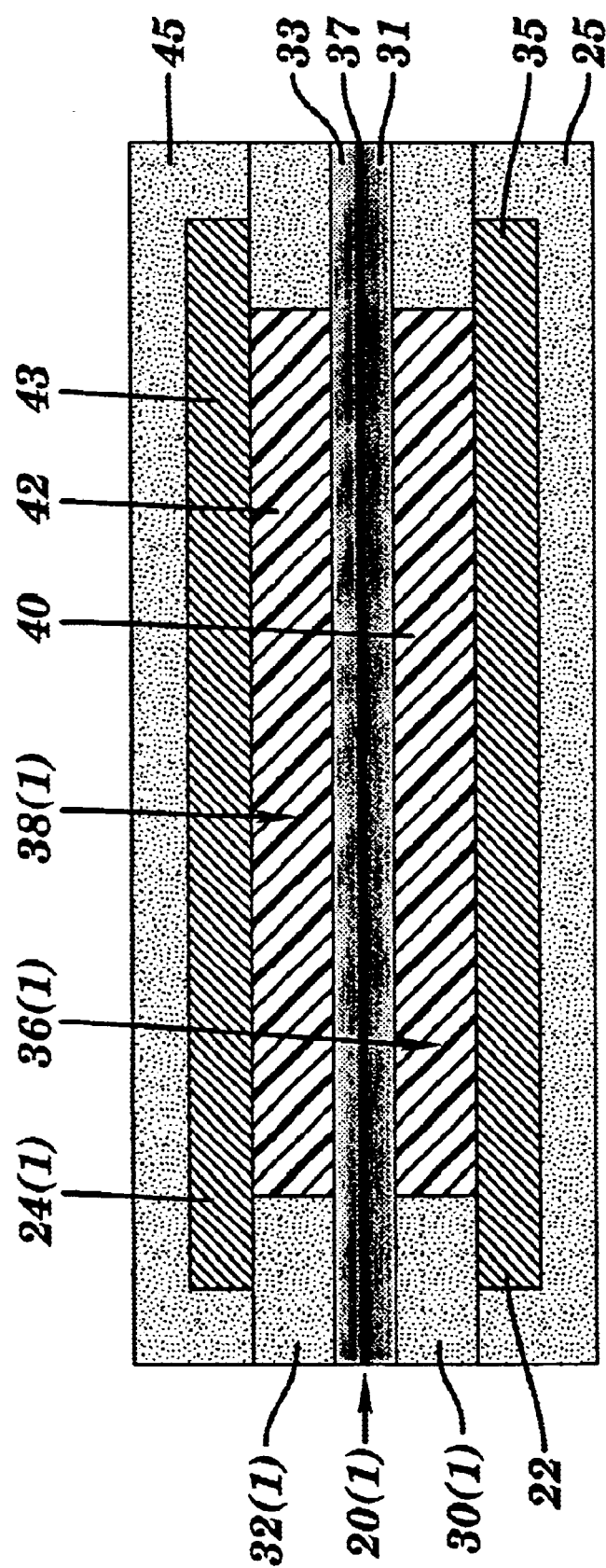

Referring to FIG. 9, a third insulating layer 45, such as silicon dioxide SiO2, is deposited over at least a portion of the second insulating layer 32(1) and the second electrode 24(1) to encapsulate the second electrode 24(1), although other types of materials can be used.

Next, one or more holes or vias (not shown) are etched to the first and second electrodes 22 and 24(1) to provide contact points and to the first and second sacrificial materials 40 and 42. The first and second sacrificial materials 40 and 42 are removed through the hole(s). A variety of techniques can be used to remove the sacrificial materials 40 and 42. For example, if the sacrificial material is polysilicon, the etchant may be xenon difluoride. Removing the first sacrificial material 40 forms a first compartment 16(1) and removing the second sacrificial material 42 forms a second compartment 18(1). The access hole to the first compartment 16(1) is closed to seal the first compartment 16(1). The first compartment 16(1) may be filled with a variety of different types of fluids, such as ambient air, and/or materials at a reference pressure or can be sealed in a vacuum. The particular reference pressure selected will vary based on the particular application and is selected to help obtain the desired movement of the member 26(1) or one of the first and second electrodes 22 and 24(1) in response to the monitored pressure.

Referring to FIG. 10, the resulting pressure transducer system 10(1) is shown. The second compartment 18(1) has a passage 28 to the ambient medium, the pressure of which is to be measured. A pressure monitoring device 26, such as a voltmeter or a programmed computer with programmed instructions stored in a memory for execution by a processor to monitor and/or measure pressure changes is coupled to the first and second electrodes 22 and 24(1).

The method for making the pressure transducer system 10(2) shown in FIG. 11 is the same as the method described for making the pressure transducer system 10(1) as described with reference to FIGS. 1–10, except as described below. In this particular embodiment, the first insulating layer 30(2) is thicker than the second insulating layer 32(2) so that the first electrode 22 is spaced further from the member 20(2) than the second electrode 24, although other configurations can be used. The second trench 36(1) in the first insulating layer 30(1) is filled with another insulating material 41, instead of the first sacrificial material 40, although the second trench 36(1) could be filled with other types of materials and/or fluids or the system 10(2) may simply have left the first insulating layer 30(1) unetched and deposit the member 20(2) directly on the first insulating layer 30(1). In this embodiment, a passage 28 is not provided to the second compartment 18(2) so that the second compartment 18(2) remains sealed. When the second sacrificial material 42 is removed, the second compartment 18(2) may be filled with other fluids and/or materials at a reference pressure. The second electrode 24(2) is made of a material and at a thickness where the second electrode 24(2) is flexible. The third insulating layer 45 is not deposited on the second electrode 24(2).

The operation of the pressure transducer system 10(1) in accordance with one embodiment will be described with reference to FIG. 10. If the pressure of the fluid exposed to the second compartment 18(1) is higher than the pressure in the first compartment 16(1), then the member 20(1) is deflected toward the first electrode 22. The portion of the induced opposite sign electrical charge on the first electrode 22 will be greater than the portion of the induced opposite sign charge on the second electrode 24(1). This difference in charge can be read by the pressure monitoring device 26. Based on the difference in induced electrical charge or potential difference across the electrodes 22 and 24(1), the pressure monitoring device 26 can provide an output which is indicative of the pressure or can determine the pressure based on the difference in the induced charge or the difference in electrical potential using for example comparison tables or other data.

If the pressure of the fluid in the second compartment 18(1) is less than the pressure in the first compartment 16(1), then the member 20(1) is deflected toward the second electrode 24(1). As a result, the portion of the induced opposite sign charge on the second electrode 24(1) will be greater than the portion of the induced opposite sign charge on the first electrode. This difference in electrical charge can also be read by the pressure monitoring device 26. Based on the difference in the induced charge or the difference in electrical potential across the electrodes 22 and 24(1), the pressure monitoring device 26 can provide an output which is indicative of this pressure or can determine this pressure based on the difference in the induced charge or the difference in electrical potential using, for example, comparison tables or other data.

The operation of the pressure transducer system 10(2) in accordance with another embodiment will be described with reference to FIG. 11. If the pressure of the fluid exposed to the second electrode 24(2) is higher than the pressure in the second compartment 18(2), then the second electrode 24(2) is deflected toward the member 20(2). The portion of the induced opposite sign charge on the second electrode 24(2) will be greater than the portion of the induce charge on the first electrode 22. This difference in charge can be read by the pressure monitoring device 26. Based on the difference in the induced electrical charge or difference in electrical potential across the electrodes 22 and 24(2), the pressure monitoring device 26 can provide an output which is indicative of the pressure or can determine the pressure based on the difference in the induced electrical charge or the difference in electrical potential using, for example, comparison tables or other data.

If the pressure of the fluid on the second electrode 24(2) is less than the pressure in the second compartment 18(2), then the second electrode 24(2) is deflected away from the member. As a result, the portion of the induced opposite sign charge on the first electrode 22 will be greater than the portion of the induced opposite sign charge on the second electrode 24(2). This difference in charge can also be read by the pressure monitoring device 26. Based on the difference in the induced charge or the difference in electrical potential across the electrodes 22 and 24(2), the pressure monitoring device 26 can provide an output which is indicative of this pressure or can determine this pressure based on the difference in the induced charge or the difference in electrical potential using, for example, comparison tables or other data.

The pressure transducer system in accordance with the present invention will be extremely sensitive to pressure changes, because the potential difference that arises from the displacement of the member 20(1) or one of the electrodes 22, 24(1), or 24(2) is large. An effective delta (incremental displacement) of less than one nanometer will generate a significant output signal with the present invention. In addition, because of the small dimensions of the pressure transducer system and its low mass, it will have a superior frequency response when compared against prior transducers.

The present invention can measure static, quasi-static, and dynamic pressures. Still further, the present invention can be used in a variety of different types of mediums and in a variety of different applications. By way of example only, a few of the applications for the pressure transducers are set forth below.

Pressure transducers in accordance with the present invention could be used in subminiature microphones where very small size and high sensitivity are important, such as in hearing aids, clandestine surveillance devices, cell phones, portable dictating devices, and others devices. Despite their small size, the microphones with the present invention will have much greater sensitivity than microphones using conventional electret materials.

Pressure transducers in accordance with the present invention could also be used in earphones and earpieces. In these applications, the pressure transducer would covert electrical signals into sounds in earphones and earpieces, to be used in hearing aids, clandestine earpieces, and other similar devices.

Pressure transducers in accordance with the present invention could also be used as hydrophones, such as for SONAR in Navy submarines and surface vessels. The hydrophones could be conveniently arranged in arrays to be towed or situated along the hulls of such vessels. The arrays would facilitate the detection of the location of sound sources. The devices would be appropriately protected in enclosures against the effects of seawater. The enclosures would be equipped with membranes that would transmit sound, but prevent water from entering the enclosures.

The pressure transducers in accordance with the present invention could also be used to monitor and/or measure gas or vapor pressure as a safety measure or for control purposes for industrial, power generation and/or transportation applications. These pressure transducers would be inexpensive to produce and small in size making their installation convenient. In some applications, it might be advantageous to equip these pressure transducers with subminiature wireless transmitters that would allow remote monitoring of the operation without the need of wires.

Pressure transducers in accordance with the present invention could also be used in barometers for sensing atmospheric pressure, in weight scales, and as a temperature transducers The above described applications are just a sample of the variety of different applications for the present invention.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefor, is not intended to limit the claimed processes to any order except as may be specified in the claims. Accordingly, the invention is limited only by the following claims and equivalents thereto.

What is claimed is:

1. A pressure transducer system comprising:
    a housing with a chamber, at least a portion of the chamber is sealed at a reference pressure;
    a non-conducting member with a stored electrical charge, the non-conducting member connected to the housing and extending at least partially across the chamber; and
    a pair of electrodes that are at least partially in alignment with each other, with each of the pair of electrodes connected to the housing and spaced from and on substantially opposing sides of the non-conducting member, wherein the non-conducting member is movable with respect to the pair of electrodes or one of the electrodes in the pair of electrodes is movable with respect to the non-conducting member in response to a monitored pressure.

2. The system as set forth in claim 1 wherein the member divides the chamber into a first compartment and a second compartment, the first compartment or the second compartment is sealed at the reference pressure.

3. The system as set forth in claim 2 further comprising at least one opening extending into the first compartment or the second compartment to the first compartment or the second compartment to the pressure to be measured, the other one of the first compartment or the second compartment is sealed at the reference pressure.

4. The system as set forth in claim 2 wherein the first compartment or the second compartment is filled with at least fluid at the reference pressure and the other one of the first compartment or the second compartment is filled with at least one material.

5. The system as set forth in claim 1 further comprising a pressure monitoring device coupled to the pair of electrodes, the pressure monitoring device determining the pressure in response to the movement of the member with respect to the pair of electrodes or the one of the electrodes in the pair of electrodes with respect to the member.

6. The system as set forth in claim 1 wherein the at least a portion of the chamber is vacuum sealed and the reference pressure is zero.

7. The system as set forth in claim 1 wherein the member comprises two or more dielectric layers.

8. The system as set forth in claim 1 wherein the member comprises a single dielectric layer.

9. The system as set forth in claim 1 wherein the member is made from one or more materials selected from a group consisting of silicon oxide, silicon dioxide, silicon nitride, aluminum oxide, tantalum oxide, tantalum pentoxide, titanium oxide, titanium dioxide, barium strontium titanium oxide.

10. A method for making a pressure transducer system, the method comprising:
    providing a housing with a chamber, at least a portion of the chamber is sealed at a reference pressure;

providing a non-conducting member with a stored electrical charge, the non-conducting member connected to the housing and extending at least partially across the chamber; and providing a pair of electrodes that are at least partially in alignment with each other, with each of the pair of electrodes connected to the housing and spaced from and on substantially opposing sides of the non-conducting member, wherein the non-conducting member is movable with respect to the pair of electrodes or one of the electrodes in the pair of electrodes is movable with respect to the non-conducting member in response to a monitored pressure.

11. The method as set forth in claim 10 wherein the provided member divides the chamber into a first compartment and a second compartment, one of the first and second compartments is sealed at the reference pressure.

12. The method as set forth in claim 11 further comprising providing at least one opening extending into the first compartment or the second compartment to expose the first compartment or the second compartment to the monitored pressure, the other one of the first compartment or the second compartment is sealed at the reference pressure.

13. The method as set forth in claim 11 further comprising filling the first compartment or the second compartment with at least fluid at the reference pressure and filling the other one of the first compartment or the second compartment with at least one material.

14. The method as set forth in claim 10 further comprising providing a pressure monitoring device coupled to the pair of electrodes, the pressure monitoring device determining the pressure in response to the movement of the member with respect to the pair of electrodes or the one of the electrodes in the pair of electrodes with respect to the member.

15. The method as set forth in claim 10 wherein the at least a portion of the chamber is vacuum sealed and the reference pressure is zero.

16. The method as set forth in claim 10 wherein the member comprises two or more dielectric layers.

17. The method as set forth in claim 10 wherein the member comprises a single dielectric layer.

18. The method as set forth in claim 10 wherein the member is made from one or more materials selected from a group consisting of silicon oxide, silicon dioxide, silicon nitride, aluminum oxide, tantalum oxide, tantalum pentoxide, titanium oxide, titanium dioxide, barium strontium titanium oxide.

19. A method for measuring pressure, the method comprising:

exposing a non-conducting member with a stored electrical charge or one of a pair of electrodes to a monitored pressure, the member is connected to a housing with a chamber, at least a portion of the chamber is sealed at a reference pressure, the non-conducting member extends across at least a portion of the chamber, each of a pair of electrodes is connected to the housing and is spaced from and on substantially opposing sides of the non-conducting member, the pair of electrodes are at least partially in alignment with each other;

moving the non-conducting member with respect to the pair of electrodes or one of the electrodes in the pair of electrodes with respect to the non-conducting member in response to a monitored pressure member in response to the monitored pressure; and measuring the movement of the non-conducting member or one of the electrodes in the pair of electrodes; and determining the monitored pressure based on the measured movement.

20. The method as set forth in claim 19 wherein the exposing the member or one of the electrodes in the pair of electrodes to a pressure to be measured further comprises exposing one of the first compartment and the second compartment to the monitored pressure through at least one opening extending into the exposed one of the first compartment and the second compartment, the other one of the first compartment and the second compartment is sealed at the reference pressure.

21. The method as set forth in claim 19 wherein the exposing the member or one of the pair of electrodes to a pressure to be measured further comprises exposing one of the electrodes in the pair of electrodes which is spaced from the member by the at least a portion of the chamber that is sealed at the reference pressure.

22. The method as set forth in claim 19 wherein moving the member with respect to the pair of electrodes or one of the electrodes in the pair of electrodes with respect to the member further comprises inducing a difference in electrical potential across the pair of electrodes.

23. The method as set forth in claim 22 wherein the measuring the movement further comprises measuring the difference in electrical potential across the pair of electrodes.

24. The method as set forth in claim 23 wherein the determining the monitored pressure further using the measure difference in electrical potential to determine the monitored pressure.

* * * * *